(12) United States Patent
Lee et al.

(10) Patent No.: US 10,396,212 B2
(45) Date of Patent: Aug. 27, 2019

(54) THIN FILM TRANSISTOR ARRAY PANEL

(71) Applicant: Samsung Display Co., Ltd., Yongin-si (KR)

(72) Inventors: Jun Hee Lee, Hwaseong-si (KR); In Jun Bae, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/871,742

(22) Filed: Jan. 15, 2018

(65) Prior Publication Data

US 2019/0013411 A1 Jan. 10, 2019

(30) Foreign Application Priority Data

Jul. 5, 2017 (KR) .................. 10-2017-0085609

(51) Int. Cl.
| | |
|---|---|
| *H01L 29/786* | (2006.01) |
| *H01L 27/32* | (2006.01) |
| *H01L 27/12* | (2006.01) |
| *H01L 23/532* | (2006.01) |
| *H01L 51/52* | (2006.01) |

(52) U.S. Cl.
CPC .. *H01L 29/78693* (2013.01); *H01L 23/53219* (2013.01); *H01L 27/124* (2013.01); *H01L 27/3246* (2013.01); *H01L 27/3258* (2013.01); *H01L 27/3262* (2013.01); *H01L 29/78696* (2013.01); *H01L 51/5203* (2013.01); *H01L 2251/558* (2013.01)

(58) Field of Classification Search
None
See application file for complete search history.

(56) References Cited

U.S. PATENT DOCUMENTS

| | | | | |
|---|---|---|---|---|
| 5,858,820 | A | * | 1/1999 | Jung .................. G02F 1/13454 438/150 |
| 8,294,158 | B2 | | 10/2012 | Park et al. |
| 9,070,717 | B2 | | 6/2015 | Lee et al. |
| 2010/0065849 | A1 | * | 3/2010 | Lee ..................... H01L 27/3244 257/72 |
| 2010/0163885 | A1 | * | 7/2010 | Park .................. H01L 21/02532 257/72 |
| 2011/0169009 | A1 | * | 7/2011 | Lee ......................... H01L 27/12 257/72 |
| 2011/0297949 | A1 | * | 12/2011 | Lee ..................... H01L 27/1251 257/66 |

(Continued)

FOREIGN PATENT DOCUMENTS

| | | |
|---|---|---|
| KR | 10-2008-0073560 | 8/2008 |
| KR | 10-2011-0056084 | 5/2011 |
| KR | 10-1049808 | 7/2011 |

*Primary Examiner* — Angel Roman
(74) *Attorney, Agent, or Firm* — H.C. Park & Associates, PLC

(57) ABSTRACT

A thin film transistor array panel according to an exemplary embodiment includes: a substrate; a metal pattern positioned on the substrate; a buffer layer positioned on the metal pattern; and a semiconductor layer positioned on the buffer layer and including a source region, a channel region, and a drain region, wherein the metal pattern overlaps at least one of the source region and the drain region, and the metal pattern does not overlap the channel region.

19 Claims, 13 Drawing Sheets

(56) References Cited

U.S. PATENT DOCUMENTS

2014/0167006 A1* 6/2014 Kim .................... H01L 27/3244
257/40
2016/0049424 A1* 2/2016 Zhang ................. H01L 27/1259
257/72
2017/0071937 A1 3/2017 Karp et al.

* cited by examiner

THIN FILM TRANSISTOR ARRAY PANEL

CROSS-REFERENCE TO RELATED APPLICATION

This application claims priority from and the benefit of Korean Patent Application No. 10-2017-0085609, filed on Jul. 5, 2017, which is hereby incorporated by reference for all purposes as if fully set forth herein.

BACKGROUND

Field

Exemplary embodiments relate to a thin film transistor array panel, and in detail, relates to a thin film transistor array panel including a metal pattern under a semiconductor layer.

Discussion of the Background

A thin film transistor (TFT) is used in various electronic devices such as a display device and the like. For example, the thin film transistor is used as a switching element or a driving element in the display device such as a liquid crystal display (LCD) or an organic light emitting diode (OLED) display.

The thin film transistor includes a gate electrode, a source electrode, a drain electrode facing the source electrode, and a semiconductor electrically connected to the source electrode and the drain electrode, and the semiconductor is an important factor for determining a characteristic of the thin film transistor.

Silicon (Si) is a widely used material for a semiconductor. Silicon is classified into amorphous silicon and polysilicon according to its crystal form. Amorphous silicon has a simple manufacturing process, but provides low charge mobility, so it has limitations in manufacturing high-performance thin film transistors. Polysilicon has high charge mobility, but requires a manufacturing stage for crystallizing the silicon, so its manufacturing costs are higher and the process is more complicated.

In a crystallization process of polysilicon, a hillock is formed in a polysilicon layer surface. The hillock is non-uniformly arranged such that a large deviation in the hillock distribution on the thin film transistor may be caused.

The above information disclosed in this Background section is only for enhancement of understanding of the background of the invention and therefore it may contain information that does not form the prior art that is already known in this country to a person of ordinary skill in the art.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a thin film transistor array panel having a uniform characteristic.

Additional aspects will be set forth in the detailed description which follows, and, in part, will be apparent from the disclosure, or may be learned by practice of the inventive concept.

According to exemplary embodiments, a thin film transistor array panel includes: a substrate; a metal pattern positioned on the substrate; a buffer layer positioned on the metal pattern; and a semiconductor layer positioned on the buffer layer and including a source region, a channel region, and a drain region, wherein the metal pattern overlaps at least one of the source region and the drain region, and the metal pattern does not overlap the channel region.

According to another exemplary embodiment, a thin film transistor array panel s includes: a substrate; a metal pattern positioned on the substrate; a buffer layer positioned on the metal pattern; a semiconductor layer positioned on the buffer layer and including a source region, a channel region, and a drain region; a gate insulating layer positioned on the semiconductor layer; and a gate electrode positioned on the gate insulating layer, wherein a surface of the semiconductor layer in contact with the gate insulating layer includes a plurality of protrusions, and the metal pattern overlaps at least one of the source region and the drain region.

According to exemplary embodiments, the thin film transistor array panel having the uniform characteristic may be provided.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
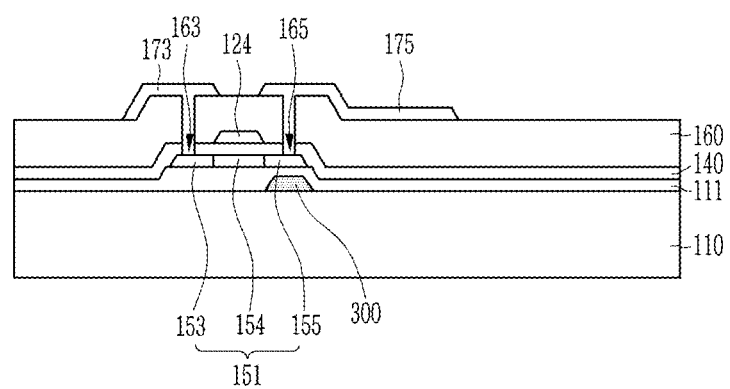
FIG. 1 is a schematic view showing a thin film transistor array panel according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference s numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or s "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the s surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a schematic view showing a thin film transistor array panel according to an exemplary embodiment. Referring to FIG. 1, a thin film transistor array panel according to the present exemplary embodiment includes a substrate 110, a buffer layer 111 positioned on the substrate 110, and a first metal pattern 300 positioned between the substrate 110 and the buffer layer 111.

A semiconductor layer 151 may be positioned on the buffer layer 111, and the semiconductor layer 151 may include a source region 153, a drain region 155, and a channel region 154. A gate insulating layer 140 may be positioned on the semiconductor layer 151, a gate electrode 124 may be positioned on the gate insulating layer 140, and an interlayer insulating layer 160 may be positioned on the gate electrode 124. A source electrode 173 may be connected to the source region 153 of the semiconductor layer 151 through a first contact hole 163 of the gate insulating layer 140 and the interlayer insulating layer 160, and a drain electrode 175 may be connected to the drain region 155 of the semiconductor layer 151 through a second contact hole 165.

Referring to FIG. 1, the first metal pattern 300 may be positioned between the buffer layer 111 and the substrate 110 and overlaps the drain region 155 of the semiconductor layer 151 in a direction perpendicular to the plane of the substrate 110. However, the first metal pattern 300 may not overlap the channel region 154 of the semiconductor layer 151.

The first metal pattern 300 may have a thickness of 2000 angstroms to 3000 angstroms. Also, the first metal pattern 300 may include molybdenum, however it is not limited thereto. The first metal pattern 300 may include a metal which has a larger thermal capacity than the semiconductor layer 151.

As the first metal pattern 300 is positioned to overlap the drain region 155 of the semiconductor layer 151, the first metal pattern 300 may act as an arrangement start point of a hillock formed in the crystallization step of the semiconductor layer 151, thereby uniformly arranging the hillock in the channel region 154 of the semiconductor layer 151 and uniformly forming a hillock distribution characteristic of the thin film transistor.

When forming the semiconductor layer 151, steps of forming an amorphous silicon layer and irradiating a laser on the amorphous silicon layer to crystallize the amorphous silicon into a crystalline silicon may be performed. In the laser irradiation crystallization process, a volume thereof increases while the amorphous silicon is crystallized, and a plurality of protrusions may be formed in the crystalline silicon surface due to the increased volume. The protrusion is referred to as a hillock, and the hillock is distributed over the entire surface of the semiconductor layer 151 after the crystallization step.

Figure 2:
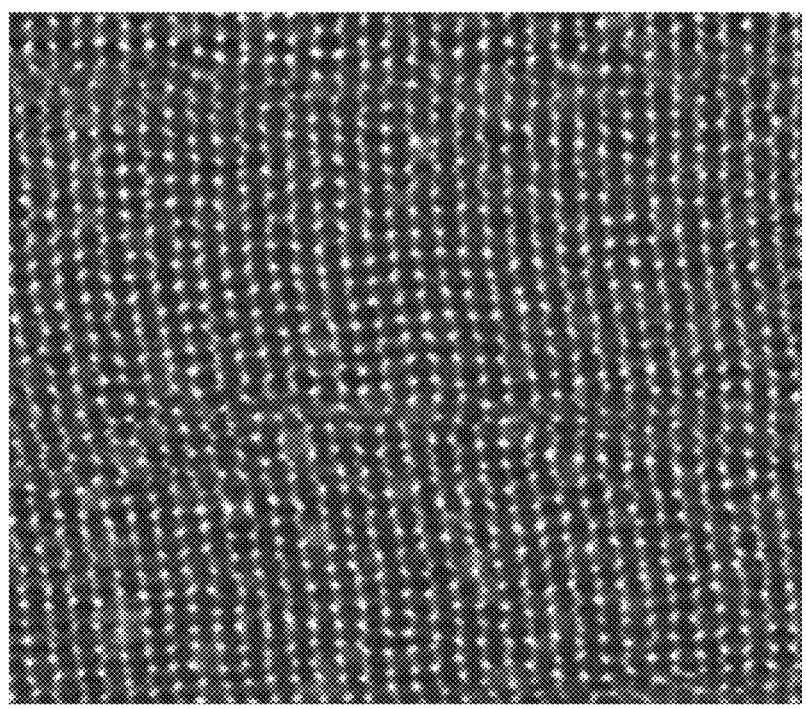
FIG. 2 shows an image in which a hillock is formed in a semiconductor layer in a thin film transistor array panel without a metal pattern.

FIG. 2 shows an image in which a hillock is formed in a semiconductor layer in a thin film transistor array panel without a metal pattern. Referring to FIG. 2, it may show that hillocks are uniformly in a partial region of the semiconductor layer, however they may be non-uniformly arranged in other regions. A characteristic difference of the thin film transistor is generated in the case that the channel region 154 of the semiconductor layer 151 is positioned at the region where the hillocks are uniformly arranged and the case that the channel region 154 is positioned at the region where the hillocks are not uniformly arranged. That is, when the channel region 154 of the semiconductor layer 151 is positioned at the region where the arrangement of the hillocks is not uniform, there may be problems where deviations of a threshold voltage of the thin film transistor, an operation voltage distribution DR_range, and hysteresis may increase by the non-uniform hillock arrangement such that a weak bright point, may be generated. The weak bright point is a phenomenon in which some element represents white because of the change of the thin film transistor characteristic such as the threshold voltage even when a voltage substantially representing black is applied.

The uniform or non-uniform arrangement of the hillocks is randomly generated in the laser irradiation process for the crystallization of the semiconductor layer 151, and it is not easy to control the hillocks to be uniformly formed in the channel region 154.

The thin film transistor array panel according to an exemplary embodiment of the present invention may include the first metal pattern 300 positioned between the substrate 110 and the buffer layer 111. This first metal pattern 300 may act as an arrangement start point of the hillock so that the hillock is uniformly arranged around the first metal pattern 300.

As above-described in an exemplary embodiment, the first metal pattern 300 may be positioned to overlap the drain region 155 of the semiconductor layer 151. The first metal pattern 300 may include the material having a higher heat capacity than the semiconductor layer 151, such as molybdenum.

The arrangement of the hillock may be started around the first metal pattern 300 by the heat capacity difference between the first metal pattern 300 and the semiconductor layer 151, thereby the region where the hillock may be uniformly formed may appear around the first metal pattern 300.

Figure 3:
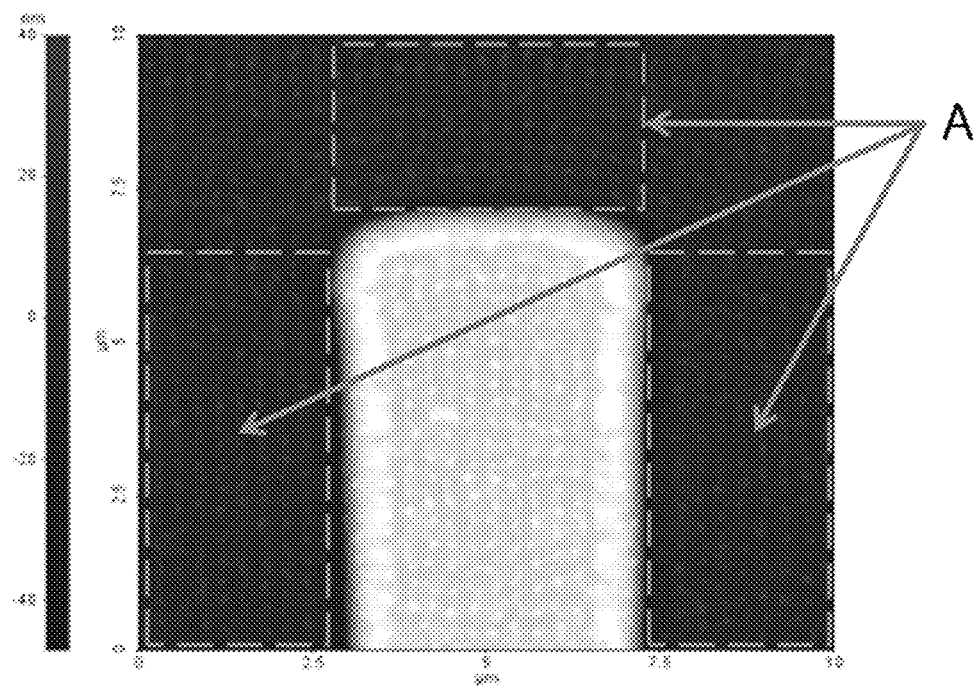
FIG. 3 shows an image in which a hillock is arranged around a metal pattern in a thin film transistor array panel according to an exemplary embodiment.

That is, the hillock may be formed from the edge of the first metal pattern 300 such that the hillock is arranged in such a manner to spread roundly around first metal pattern 300. FIG. 3 shows an image in which a hillock is arranged around a metal pattern in a thin film transistor array panel according to the present exemplary embodiment. It may be confirmed that the part shown in a lighter shade in FIG. 3 is the first metal pattern, and that the hillock of the protrusion shape is uniformly distributed with a concentric shape around the first metal pattern. Accordingly, like the region indicated by A in FIG. 3, the region where the hillock is uniformly arranged appears around the first metal pattern 300.

In an exemplary embodiment, the first metal pattern 300 is positioned to overlap the drain region 155 of the semiconductor layer 151. As confirmed in FIG. 3, since the hillock may be uniformly arranged in the semiconductor layer 151 around the first metal pattern 300, the hillock may also be uniformly arranged in the channel region 154 adjacent to the drain region 155 of the semiconductor layer 151. Accordingly, as the channel region 154 is positioned in the region where the hillock is uniformly arranged, the uniform thin film transistor characteristic may be obtained.

That is, in the thin film transistor array panel according to an exemplary embodiment, as the first metal pattern 300 acts as the alignment start point of the hillock, the characteristic that the hillock is uniformly arranged around the first metal pattern 300 is used and the first metal pattern 300 is positioned to overlap the drain region 155 adjacent to the channel region 154 of the semiconductor layer 151. Accordingly, as the hillock is uniformly arranged in the channel region 154, a uniform thin film transistor characteristic may be obtained.

In the present exemplary embodiment, the exemplary embodiment of which the first metal pattern 300 overlaps the drain region 155 is described, however the metal pattern may overlap the source region 153, or may overlap both of the drain region 155 and the source region 153 as another exemplary embodiment. A detailed variation exemplary embodiment will be described later. However, the first metal pattern 300 does not overlap the channel region 154.

Referring to FIG. 3, since the edge of the first metal pattern becomes the start point of the hillock alignment, the hillock may be uniformly arranged in the region adjacent to the first metal pattern, however the hillock may not be uniformly arranged in the region on the first metal pattern. Accordingly, when the first metal pattern 300 overlaps the channel region 154, the non-uniform hillock arrangement may be induced in the channel region 154 and this undesirably cause a deviation of the thin film transistor characteristic.

Next, the thin film transistor array panel according to an exemplary embodiment of the present invention will be described with reference to detailed drawings. FIG. 1 simply describes the thin film transistor array panel based on the first metal pattern 300 that is the main characteristic of the present disclosure, and hereinafter, the thin film transistor array panel according to an exemplary embodiment will be described with reference to FIG. 4 and FIG. 5.

Figure 4:
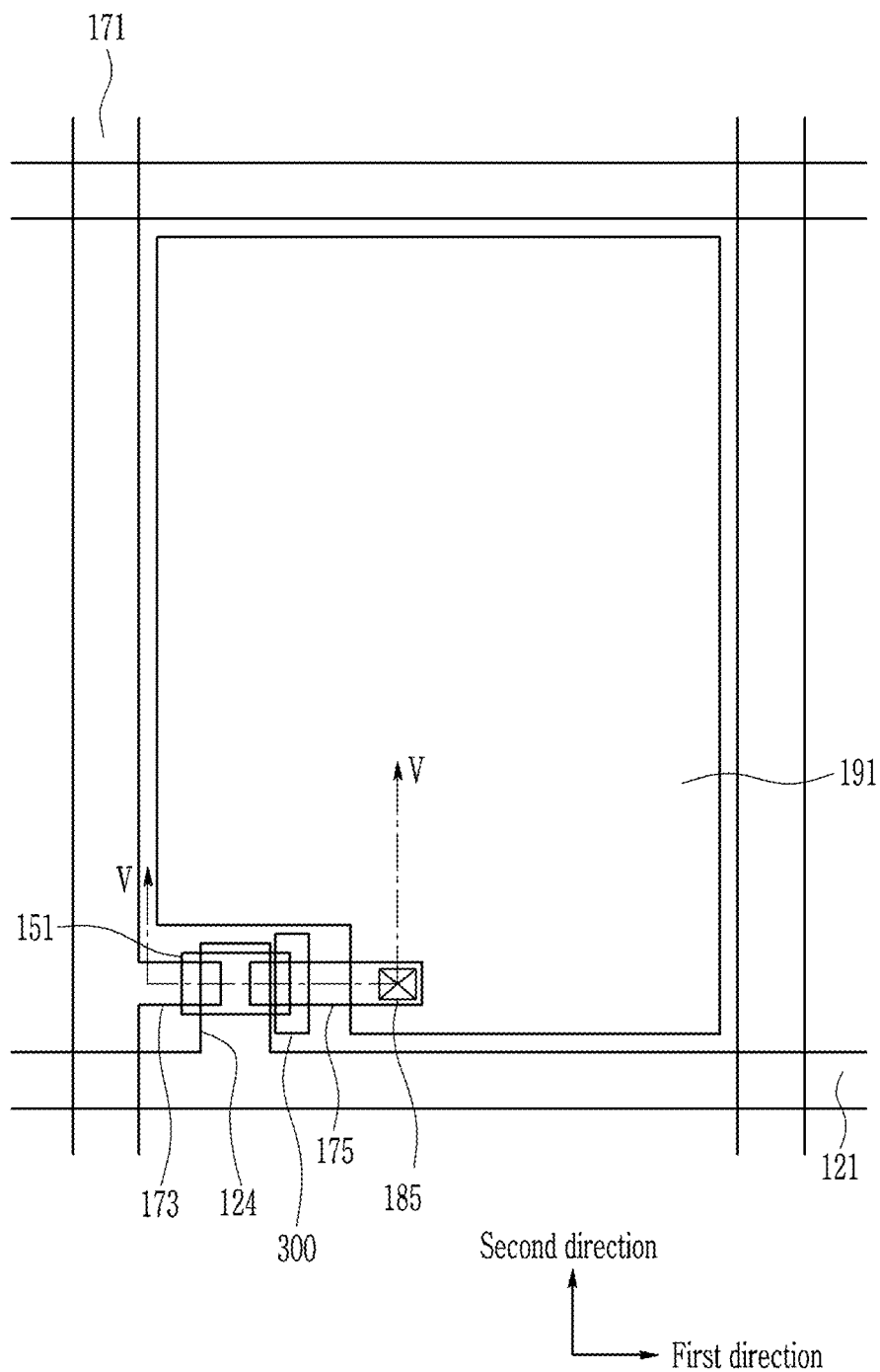
FIG. 4 is a top plan view of a pixel of a thin film transistor array panel according to an exemplary embodiment.
Figure 5:
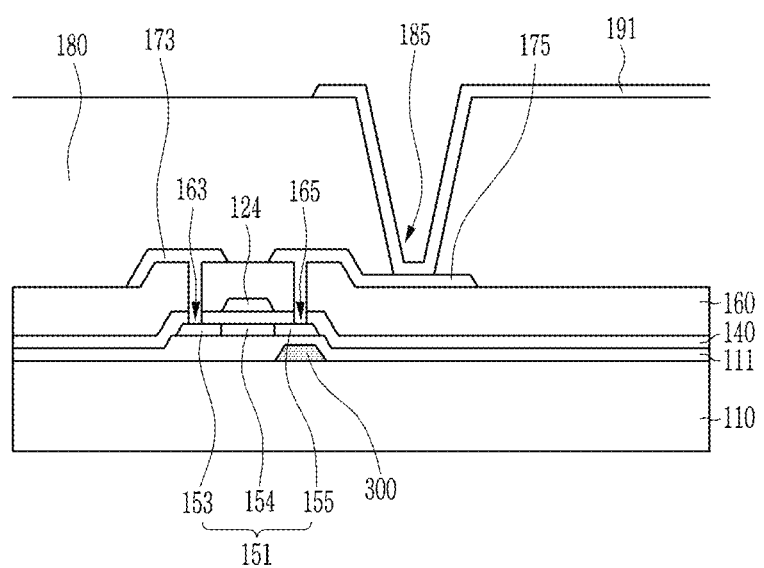
FIG. 5 is a cross-sectional view taken along a line V-V of FIG. 4.

FIG. 4 is a top plan view of a pixel of a thin film transistor array panel according to an exemplary embodiment, and FIG. 5 is a cross-sectional view taken along a line V-V of FIG. 4.

The first metal pattern 300 may be positioned on the substrate 110 made of transparent glass or plastic. Also, the first metal pattern 300 may include molybdenum, however, it is not limited thereto. The first metal pattern 300 may have a thickness of 2000 angstroms to 3000 angstroms. When the thickness of the first metal pattern 300 is less than 2000 angstroms, the heat capacity difference between the first metal pattern 300 and the semiconductor layer 151 may not be sufficient such that the hillock may not be uniformly arranged. Also, when the thickness of the first metal pattern 300 exceeds 3000 angstroms, a crack may be generated in the overlying buffer layer 111 or the gate insulating layer 140 by a step caused by the thicker first metal pattern 300.

The buffer layer 111 including a silicon oxide or a silicon nitride may be positioned on the first metal pattern 300. The semiconductor layer 151 may be positioned on the buffer layer 111. The semiconductor layer 151 may include the source region 153 and the drain region 155, and the channel region 154 positioned between the source region 153 and the drain region 155. The semiconductor layer 151 may include polysilicon, and may be doped with a p-type impurity.

The drain region 155 of the semiconductor layer 151 may overlap the first metal pattern 300. However, the first metal pattern 300 may not overlap the channel region 154 of the semiconductor layer 151.

The gate insulating layer 140 may be positioned on the semiconductor layer 151 and the buffer layer 111, and may include a silicon oxide or a silicon nitride.

A gate conductor including a gate line 121 and the gate electrode 124 may be positioned on the gate insulating layer 140. The gate conductor may include aluminum, silver, copper, molybdenum, chromium, tantalum, titanium, or alloys thereof. However, the gate conductor may additionally include various metals or conductors. The gate conductor may have a multilayer structure.

The gate line 121 may extend in a first direction and a part of the gate line 121 may extend in a second direction, thereby forming the gate electrode 124. The gate electrode 124 may overlap the channel region 154 of the semiconductor layer 151.

The interlayer insulating layer 160 may be positioned on the gate conductor and the gate insulating layer 140. The gate insulating layer 140 and the interlayer insulating layer 160 may have a first contact hole 163 and a second contact hole 165.

A data conductor including a data line 171, the source electrode 173, and the drain electrode 175 may be positioned on the interlayer insulating layer 160.

The data line 171 may transmit a data signal and extend in the second direction crossing the gate line 121.

One gate electrode 124, one source electrode 173, and one drain electrode 175 may form one thin film transistor along with the semiconductor layer 151, and the channel of the thin film transistor may be formed in the channel region 154 of the semiconductor layer 151.

The source electrode 173 may be connected to the source region 153 of the semiconductor layer through the first contact hole 163. The drain electrode 175 may be connected to the drain region 155 of the semiconductor layer through the second contact hole 165.

A passivation layer 180 may be positioned on the data conductor (171, 173, and 175) and the interlayer insulating layer 160 and may have a contact hole 185. A pixel electrode 191 may be positioned on the passivation layer 180. The pixel electrode 191 may be connected to the drain electrode 175 through the contact hole 185.

Although not shown, a light-emitting element layer, a partition, a common electrode, etc. may be positioned on the pixel electrode 191. Also, a second substrate facing the substrate 110 and a liquid crystal layer between the substrate 110 and the second substrate may be further included. That is, the thin film transistor array panel of the present exemplary embodiment may be applied to a liquid crystal display, and may also be applied to an organic light emitting diode display including an organic light emitting element.

In FIG. 4, the exemplary embodiment in which the source electrode 173 having a rectangle shape is described. However, the shape of the source electrode 173 may be various shapes such as a "U" shape or an "S" shape. In this case, the width of the semiconductor layer 151 may be varied in the second direction. However, in this exemplary embodiment, the width of the first metal pattern 300 in the second direction may be equal to or greater than the width of the semiconductor layer 151 in the second direction, and the entire channel region 154 of the semiconductor layer 151 may completely overlaps the region where the hillock is arranged by the first metal pattern 300.

As described above, the thin film transistor array panel according to an exemplary embodiment of the present invention may include the first metal pattern 300 overlapping the drain region 155 of the semiconductor layer 151, and the first metal pattern 300 may act as the alignment start point of the hillock formed in the crystallization process of the semiconductor layer 151. Thereby the hillock may be uniformly arranged in the channel region 154. Accordingly, the undesirable hillock distribution characteristic of the thin film transistor may be reduced and a uniform thin film transistor hillock distribution characteristic may be obtained.

Hereinafter, effects of the thin film transistor array panel according to the present exemplary embodiment will be described through an experimental example. In detail, the threshold voltage $V_{th}$, the DR_range, and the hysteresis are measured for the thin film transistor array panel of Comparative Example 1 without the first metal pattern and Exemplary Example 1 including the first metal pattern (molybdenum, thickness: 2500 angstroms), and an average thereof, a standard deviation, and a distribution improvement degree are shown in Table 1. The DR_range as a voltage representing an operation range of a driving transistor TR is the voltage required for driving the display device of a black stage to full white. The hysteresis measures and represents a $\Delta V_{th}$ value in a hysteresis curve of the transistor.

TABLE 1

| | $V_{th}$ | | | DR_range | | | Hysteresis | | |
|---|---|---|---|---|---|---|---|---|---|
| | Average | Standard deviation | Distribution improvement | Average | Standard deviation | Distribution improvement | Average | Standard deviation | Distribution improvement |
| Comparative Example 1 | 3.11 | 0.237 | 14.90% | 2.092 | 0.056 | 15.32% | 0.23 | 0.020 | 31.11% |
| Exemplary Example 1 | 3.57 | 0.201 | | 2.013 | 0.047 | | 0.23 | 0.014 | |

Figure 6:
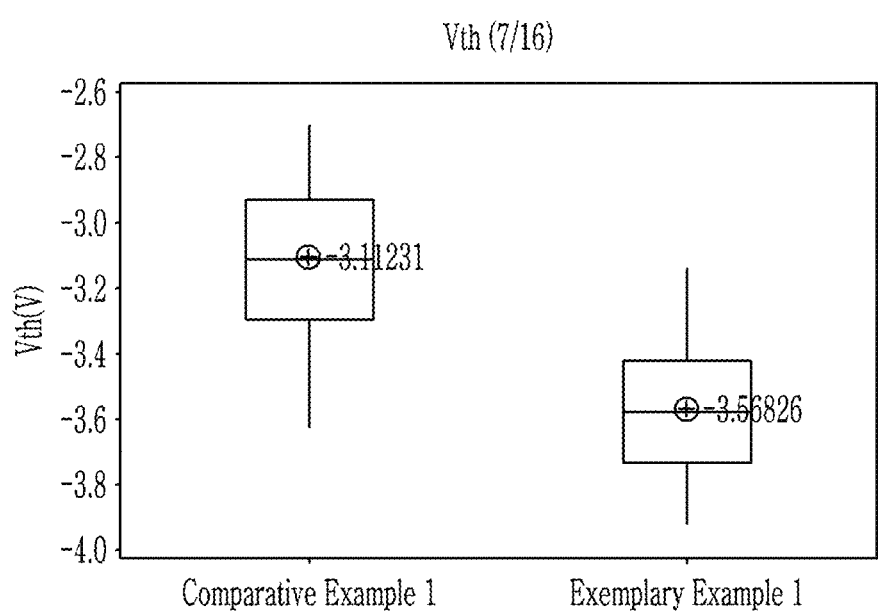
FIG. 6 shows a threshold voltage measuring result for Comparative Example 1 and Exemplary Example 1.
Figure 7:
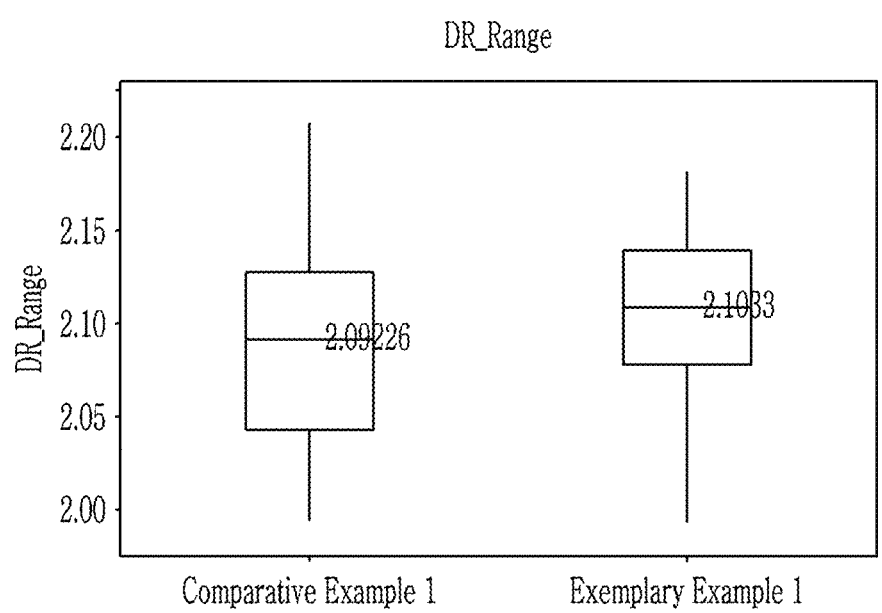
FIG. 7 shows a DR_range measuring result for Comparative Example 1 and Exemplary Example 1.
Figure 8:
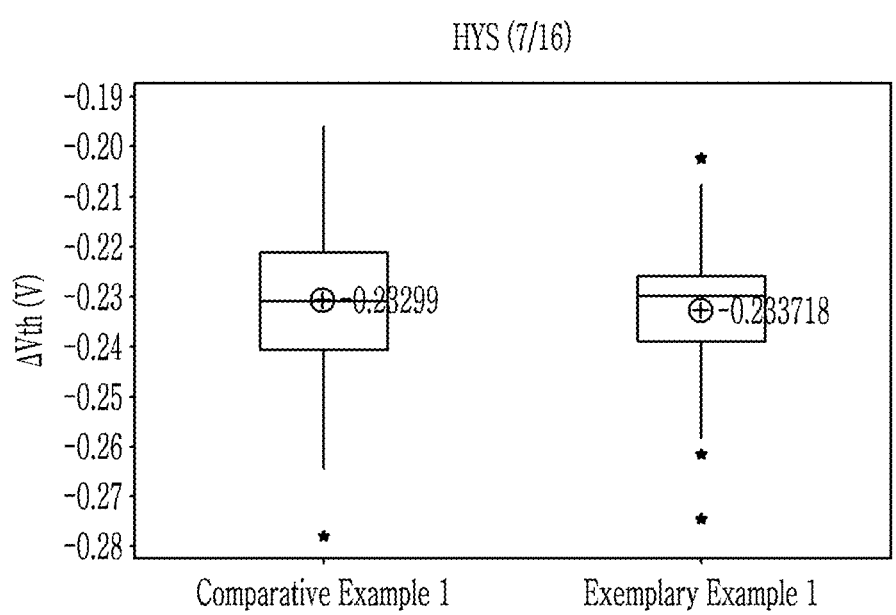
FIG. 8 shows a hysteresis measuring result for Comparative Example 1 and Exemplary Example 1.

The threshold voltage measuring result for Comparative Example 1 and Exemplary Example 1 is shown in FIG. 6, the DR_range measuring result is shown in FIG. 7, and the hysteresis measuring result is shown in FIG. 8. In the present experimental example, the measuring is performed at forty positions of the thin film transistor array panel, and the average and the standard deviation are derived based on the measured values.

Referring to Table 1, and FIGS. 6, 7, and 8, in the thin film transistor array panel of Exemplary Example 1 including the first metal pattern compared with the thin film transistor array panel of Comparative Example 1 without the first metal pattern, it is shown that the standard deviation decreases and the distribution is improved.

Thus, the reduction in the standard deviation of each characteristic of the thin film transistor array panel means that the hillock distribution characteristic of the thin film transistor is made uniform. Accordingly, the thin film transistor array panel according to the present exemplary embodiment may reduce stains or the weak bright point defect caused by the non-uniformity of the thin film transistor hillock distribution characteristic.

Next, the thin film transistor array panel according to an exemplary embodiment of the present invention will be described with reference to FIGS. 9, 10, 11, 12, and 13. FIGS. 9, 10, 11, and 12 are cross-sectional views of a thin film transistor array panel according to an exemplary embodiment, and FIG. 13 is a view showing various shapes of a metal pattern according to an exemplary embodiment of the present invention. FIGS. 9, 10, 11, and 12 show a schematic cross-section like in FIG. 1.

Figure 9:
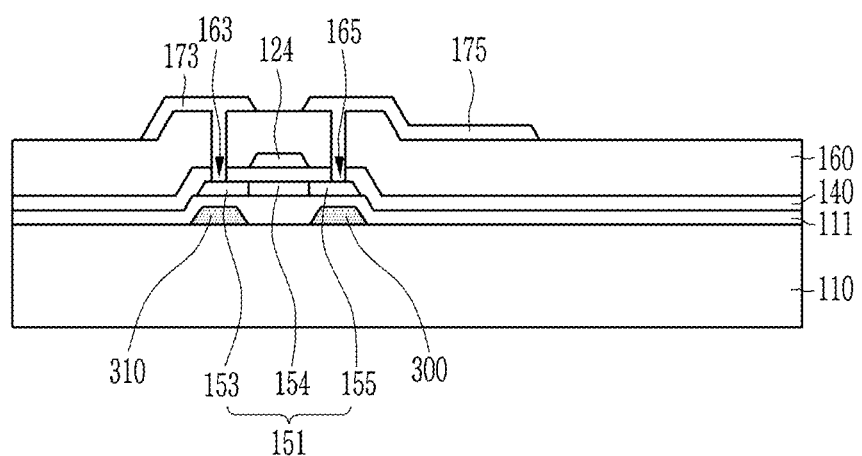
FIG. 9, FIG. 10, FIG. 11, and FIG. 12 are cross-sectional views of a thin film transistor array panel according to an exemplary embodiment.

FIG. 9 shows the thin film transistor array panel according to another exemplary embodiment. Referring to FIG. 9, the thin film transistor array panel according to the present exemplary embodiment may be similar to the thin film transistor array panel described in FIG. 1. The detailed description for the same constituent elements is omitted.

Referring to FIG. 9, a second metal pattern 310 may be formed to overlap the source region 153 of the semiconductor layer 151. That is, the first metal pattern 300 overlapping the drain region 155 of the semiconductor layer 151 and the second metal pattern 310 overlapping the source region 153 of the semiconductor layer 151 may be positioned between the substrate 110 and the buffer layer 111.

In this case, each of the first metal pattern 300 and the second metal pattern 310 may acts as the alignment start point of the hillock in the crystallization process of the semiconductor layer 151, thereby uniformly arranging the hillock in the channel region 154 of the semiconductor layer 151.

That is, in the case of the exemplary embodiment of FIG. 9, since the first metal pattern 300 and the second metal pattern 310 are both formed, compared with FIG. 1, the uniformity of the hillock arrangement may further extend into the channel region 154 of the semiconductor layer 151.

Figure 10:
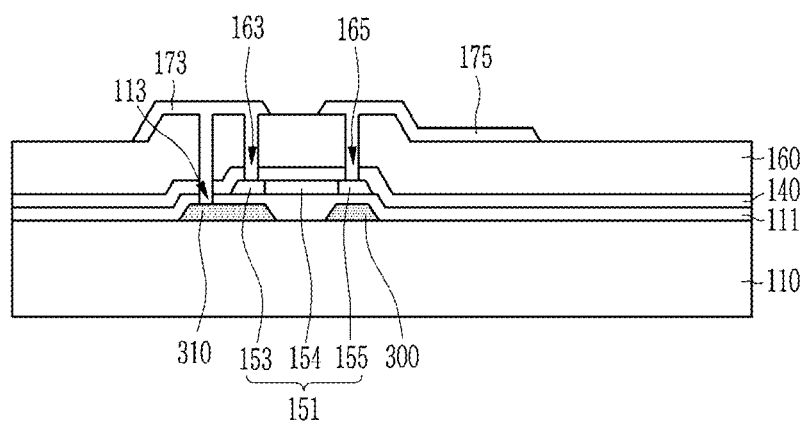

FIG. 10 is a view showing a thin film transistor array panel according to an exemplary embodiment. Referring to FIG. 10, the thin film transistor array panel according to the present exemplary embodiment is similar to the thin film transistor array panel described in FIG. 9. The detailed description for the same constituent elements is omitted.

Referring to FIG. 10, a source contact hole 113 may be formed in the interlayer insulating layer 160, the gate insulating layer 140, and the buffer layer 111. The source electrode 173 and the second metal pattern 310 may be in contact through the source contact hole 113.

When the second metal pattern 310 is not in contact with the source electrode 173 to be separated therefrom, since the second metal pattern 310 is in a floating state, static electricity, etc. may be produced during long-time driving. However, like the present exemplary embodiment, this problem may be prevented when the source electrode 173 and the second metal pattern 310 are connected.

Figure 11:
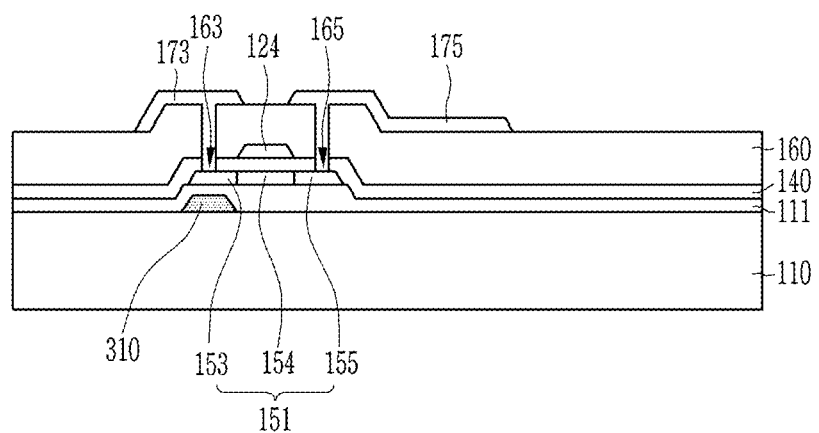

FIG. 11 is a view showing a thin film transistor array panel according to an exemplary embodiment. Referring to FIG. 11, the thin film transistor array panel according to the present exemplary embodiment may be similar to the thin film transistor array panel described in FIG. 1. The detailed description for the same constituent elements is omitted.

However, referring to FIG. 11, in the thin film transistor array panel according to the present exemplary embodiment, the second metal pattern 310 may be positioned to overlap the source region 153 of the semiconductor layer 151 and the first metal pattern 300 may be omitted. That is, the first metal pattern 300 may be positioned to overlap the drain region 155 of the semiconductor layer 151 in FIG. 1, however only the second metal pattern 310 is positioned to overlap the source region 153 of the semiconductor layer 151 in the present exemplary embodiment.

Also, in this case, the second metal pattern 310 may act as the arrangement start point of the hillock generated in the crystallization process of the semiconductor layer 151, thereby obtaining the uniform arrangement of the hillock in the channel region 154 of the semiconductor layer 151. That is, when the second metal pattern 310 is positioned to overlap the source region 153 of the semiconductor layer 151, the effect thereof may be the same as that of the exemplary embodiment of FIG. 1.

Figure 12:
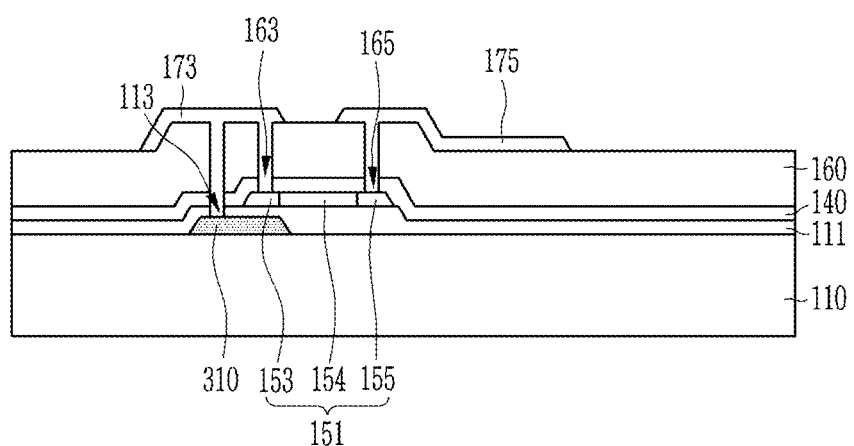
Figure 13:
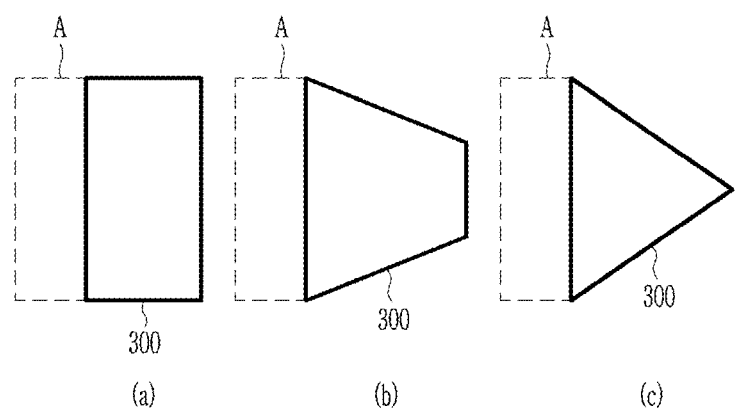
FIG. 13 is a view showing various shapes of a metal pattern according to an exemplary embodiment.

FIG. 12 is a view of a thin film transistor array panel according to another exemplary embodiment. Referring to FIG. 12, the thin film transistor array panel according to the present exemplary embodiment is similar to the thin film transistor array panel described in FIG. 11. The detailed description for the same constitution elements is omitted.

Referring to FIG. 12, the source contact hole 113 may be formed in the interlayer insulating layer 160, the gate insulating layer 140, and the buffer layer 111. The source electrode 173 and the second metal pattern 310 may be in contact through the source contact hole 113. Accordingly, like the exemplary embodiment of FIG. 10, the problem that the static electricity is produced at the second metal pattern 310 may be prevented.

That is, as above-described, the thin film transistor array panel according to the various exemplary embodiments may include the first metal pattern 300 and/or the second metal pattern 310 disposed between the buffer layer 111 and the substrate 110. The first metal pattern 300 may overlap the drain region 155 of the semiconductor layer 151 such that the hillock of the channel region 154 is uniformly arranged, and the second metal pattern 310 may overlap the source region 153 of the semiconductor layer 151 such that the hillock of the channel region 154 is uniformly arranged.

In this way, when the hillock of the channel region 154 is uniformly arranged, the hillock distribution characteristic of the thin film transistor becomes uniform, thereby stabilizing performance. Particularly, the stains or the weak bright point defect generated by the uneven hillock distribution may be solved.

Also, the second metal pattern 310 may be connected to the source electrode 173 through the source contact hole 113 of the interlayer insulating layer 160, the gate insulating layer 140, and the buffer layer 111, and the static electricity may be prevented from being produced in the second metal pattern 310.

In the previous exemplary embodiment, the first metal pattern 300 or the second metal pattern 310 have a rectangle shape on a plane parallel to the substrate, however the first metal pattern 300 or the second metal pattern 310 of the present invention is not limited to this shape. That is, the first metal pattern 300 and the second metal pattern 310 may have various shapes. FIG. 13 is a view showing various shapes of the first metal pattern 300 and the second metal pattern 310 according to an exemplary embodiment.

Referring to FIG. 13, the first metal pattern and the second metal pattern 310 may have a rectangle shape like FIG. 13 (*a*), a trapezoid shape like FIG. 13 (*b*), or a triangle shape like FIG. 13 (*c*). However, these shapes are only exemplary, and is the metal patterns are not limited thereto.

This is because the shape of the other region does not affect the hillock arrangement of the channel region when the first metal pattern 300 is adjacent to the channel region and has one side of a straight line, since each boundary surface of the first metal pattern 300 becomes the arrangement start point of the hillock.

However, since one side contacting the channel region is required at a minimum, it is not preferable for the first metal pattern 300 or the second metal pattern 310 to have a curved shape.

In FIG. 13, it is preferable that each part indicated by A becomes a part where the channel region of the semiconductor layer is positioned. When forming the thin film transistor array panel, in a case that a margin to dispose the first metal pattern 300 or the second metal pattern 310 is not sufficient, the shape may be varied such as in FIG. 13 (b) or FIG. 13 (c). Thereby, the first metal pattern 300 or the second metal pattern 310 may also be disposed in the narrow space.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel, comprising:
   a substrate;
   a metal pattern disposed on the substrate;
   a buffer layer disposed on the metal pattern; and
   a semiconductor layer disposed on the buffer layer and comprising a source region, a channel region, and a drain region,
   a first electrode disposed on the semiconductor layer,
   wherein the metal pattern overlaps at least one of the source region and the drain region, and
   wherein the metal pattern does not overlap the channel region and the first electrode.

2. The thin film transistor array panel of claim 1, wherein the thickness of the metal pattern is 2000 angstroms to 3000 angstroms.

3. The thin film transistor array panel of claim 1, wherein the metal pattern comprises a first metal pattern overlapping the drain region.

4. The thin film transistor array panel of claim 3, wherein the metal pattern further comprises a second metal pattern overlapping the source region.

5. The thin film transistor array panel of claim 1, wherein the metal pattern comprises a first metal pattern overlapping the source region.

6. The thin film transistor array panel of claim 5, further comprising:
   an interlayer insulating layer disposed on the metal pattern; and
   a source electrode disposed on the interlayer insulating layer,
   wherein the interlayer insulating layer comprises a source contact hole, and
   wherein the first metal pattern and the source electrode are in contact through the source contact hole.

7. The thin film transistor array panel of claim 6, wherein the metal pattern further comprises a second metal pattern overlapping the drain region.

8. The thin film transistor array panel of claim 1, wherein the metal pattern comprises molybdenum.

9. The thin film transistor array panel of claim 1, further comprising:
   a gate insulating layer disposed on the semiconductor layer; and
   a gate electrode disposed on the gate insulating layer.

10. The thin film transistor array panel of claim 1, wherein:
    the semiconductor layer comprises a crystallized silicon,
    a surface of the semiconductor layer in contact with the gate insulating layer comprises a plurality of protrusions, and
    the protrusions are uniformly arranged in the channel region.

11. The thin film transistor array panel of claim 1, wherein the metal pattern has a shape comprising at least one straight side.

12. The thin film transistor array panel of claim 11, wherein a length of at least one side of the metal pattern is equal to or longer than a length in a direction parallel to the side of the channel region.

13. A thin film transistor array panel, comprising:
    a substrate;
    a metal pattern disposed on the substrate;
    a buffer layer disposed on the metal pattern;
    a semiconductor layer disposed on the buffer layer and comprising a source region, a channel region, and a drain region;
    a gate insulating layer disposed on the semiconductor layer; and
    a gate electrode disposed on the gate insulating layer,
    wherein a surface of the semiconductor layer in contact with the gate insulating layer comprises a plurality of protrusions, and
    wherein the metal pattern overlaps at least one of the source region and the drain region.

14. The thin film transistor array panel of claim 13, wherein an arrangement of the protrusions disposed in the channel region is more uniform than in the source region or the drain region.

15. The thin film transistor array panel of claim 13, wherein the metal pattern does not overlap the channel region.

16. The thin film transistor array panel of claim 13, wherein the thickness of the metal pattern is 2000 angstroms to 3000 angstroms.

17. The thin film transistor array panel of claim 13, wherein the metal pattern comprises a first metal pattern overlapping the drain region and a second metal pattern overlapping the source region.

18. The thin film transistor array panel of claim 13, further comprising:
    an interlayer insulating layer disposed on the metal pattern; and
    a source electrode disposed on the interlayer insulating layer,
    wherein the metal pattern comprises a first metal pattern overlapping the source region,
    wherein the interlayer insulating layer comprises a source contact hole, and
    wherein the first metal pattern and the source electrode are in contact through the source contact hole.

19. The thin film transistor array panel of claim 18, wherein the metal pattern further comprises a second metal pattern overlapping the drain region.

* * * * *